(12) United States Patent
Lee et al.

(10) Patent No.: US 10,658,350 B2
(45) Date of Patent: May 19, 2020

(54) SEMICONDUCTOR PACKAGE

(71) Applicant: Samsung Electronics Co., Ltd., Suwon-si, Gyeonggi-do (KR)

(72) Inventors: Seonggwan Lee, Dae-gu (KR); Chul Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/137,743

(22) Filed: Sep. 21, 2018

(65) Prior Publication Data
US 2019/0244944 A1    Aug. 8, 2019

(30) Foreign Application Priority Data
Feb. 5, 2018   (KR) .................. 10-2018-0013998

(51) Int. Cl.
*H01L 25/18* (2006.01)
*H01L 25/065* (2006.01)
(Continued)

(52) U.S. Cl.
CPC .......... *H01L 25/18* (2013.01); *H01L 23/3128* (2013.01); *H01L 23/3135* (2013.01); *H01L 23/49816* (2013.01); *H01L 24/05* (2013.01); *H01L 24/48* (2013.01); *H01L 25/0652* (2013.01); *H01L 25/0657* (2013.01); *H01L 24/32* (2013.01); *H01L 24/33* (2013.01);
(Continued)

(58) Field of Classification Search
CPC ........... H01L 23/49816; H01L 23/3128; H01L 23/3135; H01L 2224/49175; H01L 2224/73265; H01L 24/48; H01L 2224/73215; H01L 2224/33181; H01L 2224/32145; H01L 2224/32225; H01L 24/73; H01L 24/49; H01L 24/45; H01L 2225/06562; H01L 2225/0651; H01L 2225/06506; H01L 2924/14; H01L 2924/00014
USPC ........................................................ 257/777
See application file for complete search history.

(56) References Cited

U.S. PATENT DOCUMENTS 8,125,063 B2   2/2012  Wang
8,557,635 B2   10/2013 Omizo et al.
(Continued)

FOREIGN PATENT DOCUMENTS

JP    2016-178196 A    10/2016

*Primary Examiner* — Jasmine J Clark
(74) *Attorney, Agent, or Firm* — Lee IP Law, PC

(57) ABSTRACT

A semiconductor package including a substrate including an external terminal; a first semiconductor chip on the substrate and having a first and a second region; at least one second semiconductor chip on the second region of the first semiconductor chip, the at least one second semiconductor chip exposing a top surface of the first region of the first semiconductor chip; and at least one third semiconductor chip on the at least one second semiconductor chip, wherein the first semiconductor chip includes a first pad electrically connected to the at least one second semiconductor chip; a second pad electrically connected to the at least one third semiconductor chip; and a third pad electrically connected to the external terminal, the first pad is on the top surface of the first region, and at least one of the second pad and the third pad is on a top surface of the second region.

20 Claims, 14 Drawing Sheets

(51) Int. Cl.
  *H01L 23/00*   (2006.01)
  *H01L 23/31*   (2006.01)
  *H01L 23/498*  (2006.01)

(52) U.S. Cl.
  CPC .............. *H01L 24/45* (2013.01); *H01L 24/49* (2013.01); *H01L 24/73* (2013.01); *H01L 2224/0401* (2013.01); *H01L 2224/04042* (2013.01); *H01L 2224/32145* (2013.01); *H01L 2224/32225* (2013.01); *H01L 2224/33181* (2013.01); *H01L 2224/45139* (2013.01); *H01L 2224/45144* (2013.01); *H01L 2224/48091* (2013.01); *H01L 2224/48106* (2013.01); *H01L 2224/48145* (2013.01); *H01L 2224/48227* (2013.01); *H01L 2224/49175* (2013.01); *H01L 2224/73204* (2013.01); *H01L 2224/73215* (2013.01); *H01L 2224/73257* (2013.01); *H01L 2224/73265* (2013.01); *H01L 2225/0651* (2013.01); *H01L 2225/06506* (2013.01); *H01L 2225/06517* (2013.01); *H01L 2225/06562* (2013.01); *H01L 2225/06586* (2013.01); *H01L 2924/1434* (2013.01); *H01L 2924/15192* (2013.01); *H01L 2924/15311* (2013.01)

(56) References Cited

U.S. PATENT DOCUMENTS

| | | | |
|---|---|---|---|
| 8,691,628 | B2 | 4/2014 | Tane et al. |
| 8,896,111 | B2 | 11/2014 | Tanimoto et al. |
| 9,129,846 | B2 * | 9/2015 | Song ................ H01L 25/105 |
| 9,412,720 | B2 | 8/2016 | Nam et al. |
| 9,496,216 | B2 | 11/2016 | Chun et al. |
| 2009/0096111 | A1 * | 4/2009 | Fujiwara .............. H01L 21/561 |
| | | | 257/777 |
| 2010/0314740 | A1 | 12/2010 | Choi et al. |
| 2016/0276312 | A1 | 9/2016 | Shimizu et al. |
| 2017/0033081 | A1 | 2/2017 | Yoo et al. |
| 2017/0358564 | A1 * | 12/2017 | Lee ................... H01L 23/3121 |

* cited by examiner

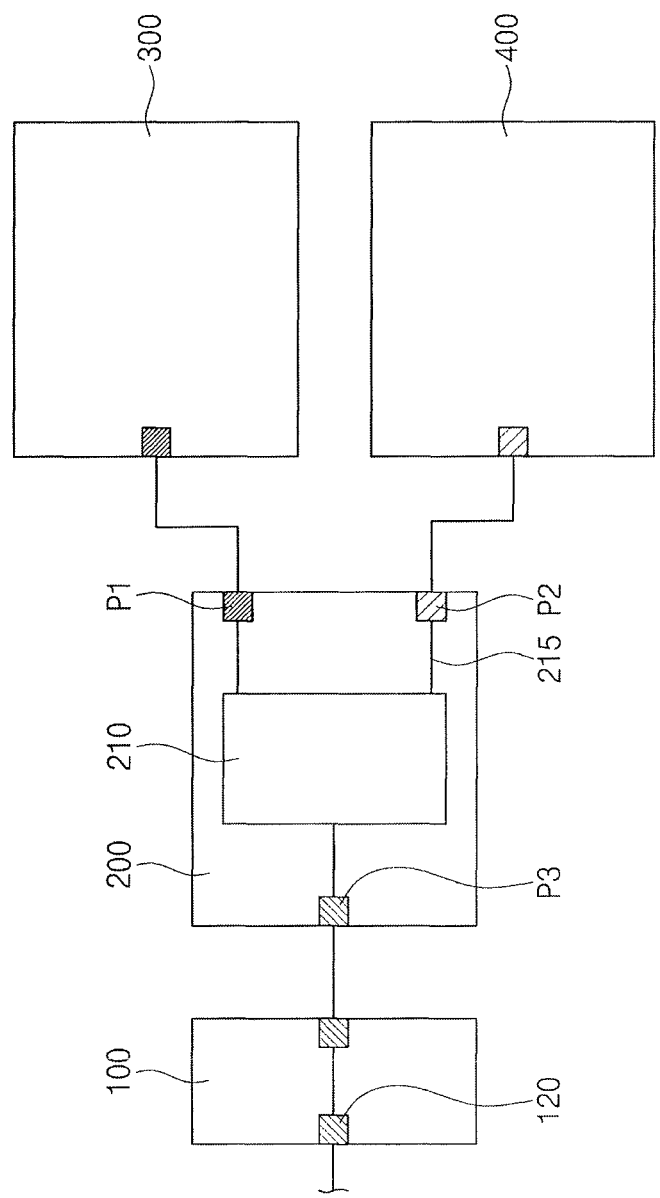

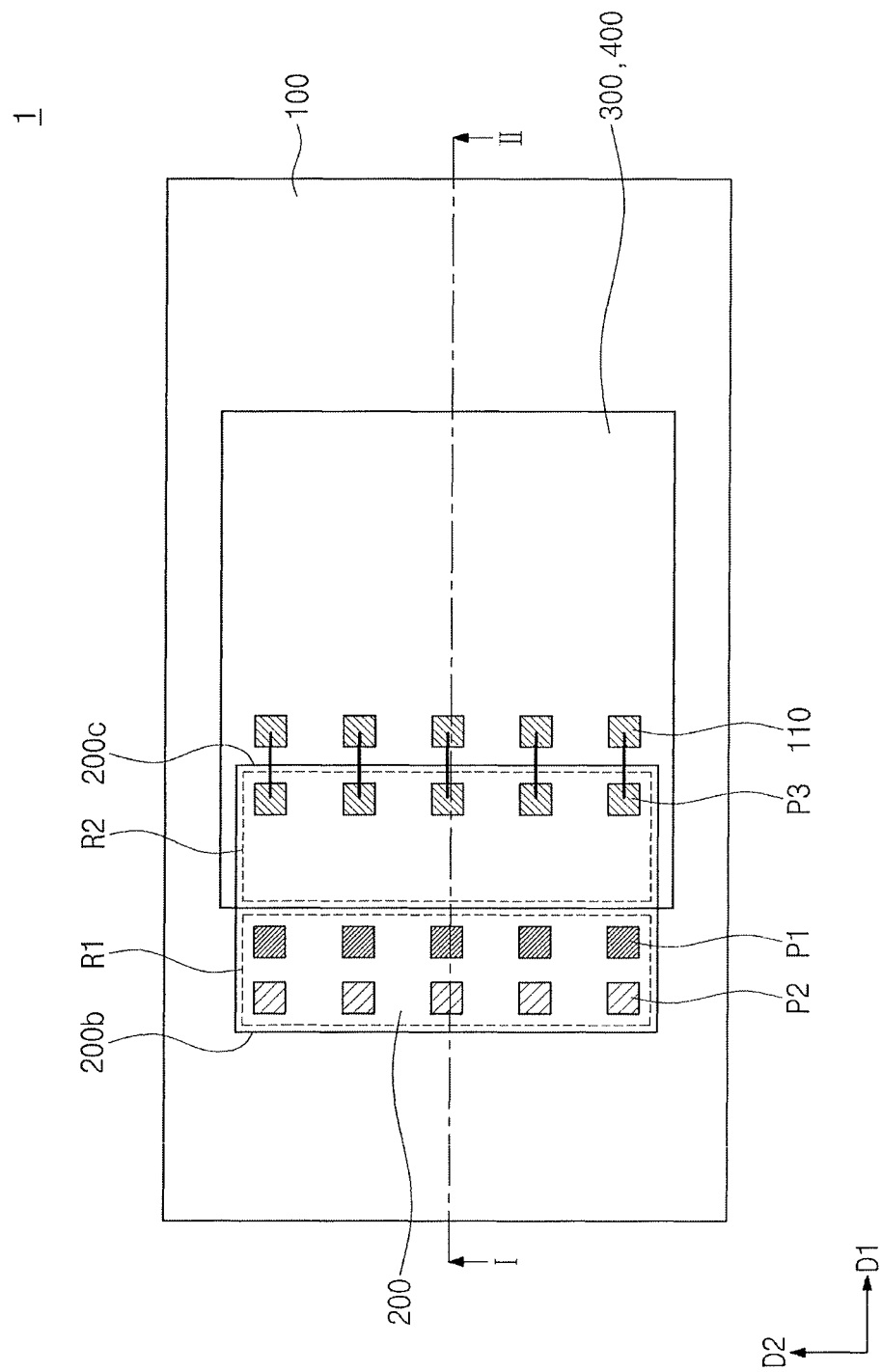

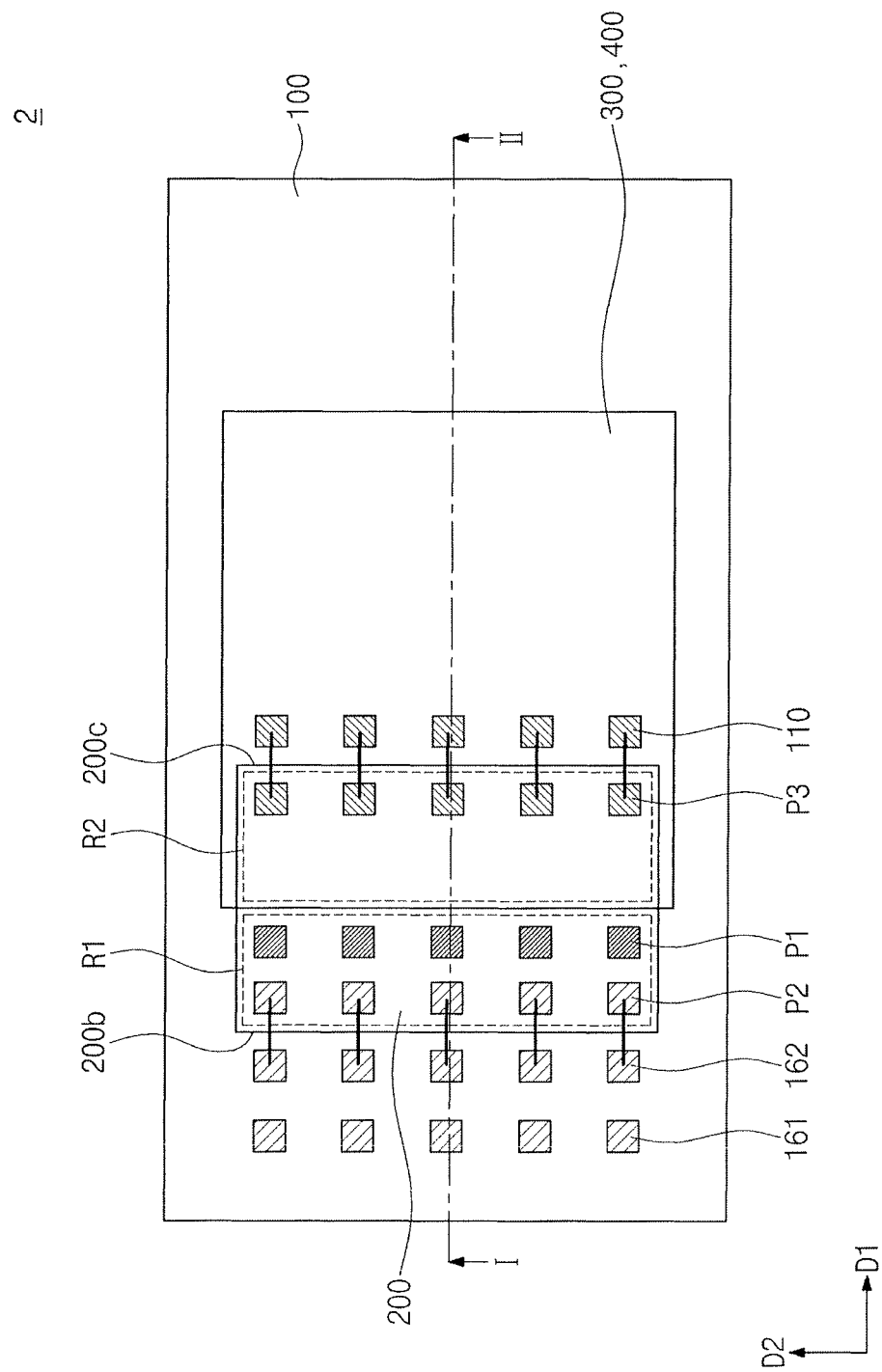

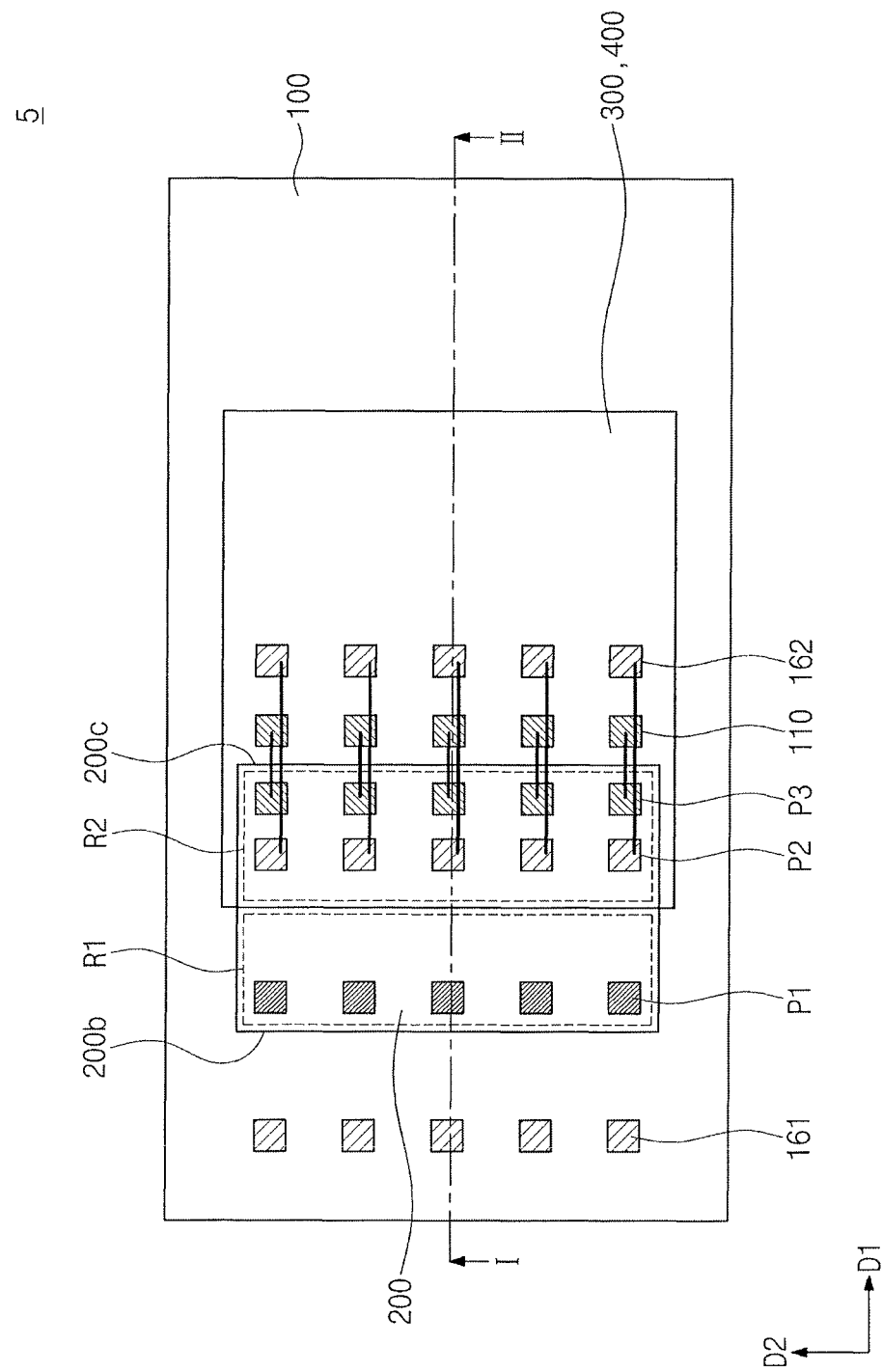

SEMICONDUCTOR PACKAGE

CROSS-REFERENCE TO RELATED APPLICATION

Korean Patent Application No. 10-2018-0013998 filed on Feb. 5, 2018, in the Korean Intellectual Property Office, and entitled: "Semiconductor Package," is incorporated by reference herein in its entirety.

BACKGROUND

1. Field

Embodiments relate to a semiconductor package.

2. Description of the Related Art

A semiconductor package is provided to implement an integrated circuit chip to qualify for use in electronic products.

SUMMARY

The embodiments may be realized by providing a semiconductor package including a substrate including an external terminal; a first semiconductor chip on the substrate, the first semiconductor chip having a first region and a second region in a plan view; at least one second semiconductor chip on the second region of the first semiconductor chip, the at least one second semiconductor chip exposing a top surface of the first region of the first semiconductor chip; and at least one third semiconductor chip on the at least one second semiconductor chip, wherein the first semiconductor chip includes a first pad electrically connected to the at least one second semiconductor chip; a second pad electrically connected to the at least one third semiconductor chip; and a third pad electrically connected to the external terminal, the first pad is on the top surface of the first region, and at least one of the second pad and the third pad is on a top surface of the second region.

The embodiments may be realized by providing a semiconductor package including a substrate; a first semiconductor chip on the substrate and including a first pad, a second pad, and a third pad, the first pad, the second pad, and the third pad being on a top surface of the first semiconductor chip; at least one second semiconductor chip on the first semiconductor chip, the at least one second semiconductor chip partially exposing the top surface of the first semiconductor chip; and at least one third semiconductor chip on the at least one second semiconductor chip, wherein the first pad is electrically connected to the at least one second semiconductor chip, the second pad is electrically connected to the at least one third semiconductor chip, the third pad is electrically connected to the first pad and the second pad, and the at least one second semiconductor chip exposes the first pad and covers at least one of the second pad and the third pad.

BRIEF DESCRIPTION OF THE DRAWINGS

Features will be apparent to those of skill in the art by describing in detail exemplary embodiments with reference to the attached drawings in which:

FIG. 1 illustrates a schematic diagram showing an electrical connection of a semiconductor package according to exemplary embodiments.

FIG. 2A illustrates a plan view showing a semiconductor package according to exemplary embodiments.

FIG. 3A illustrates a plan view showing a semiconductor package according to exemplary embodiments.

FIG. 6A illustrates a plan view showing a semiconductor package according to exemplary embodiments.

DETAILED DESCRIPTION

Figure 2B:
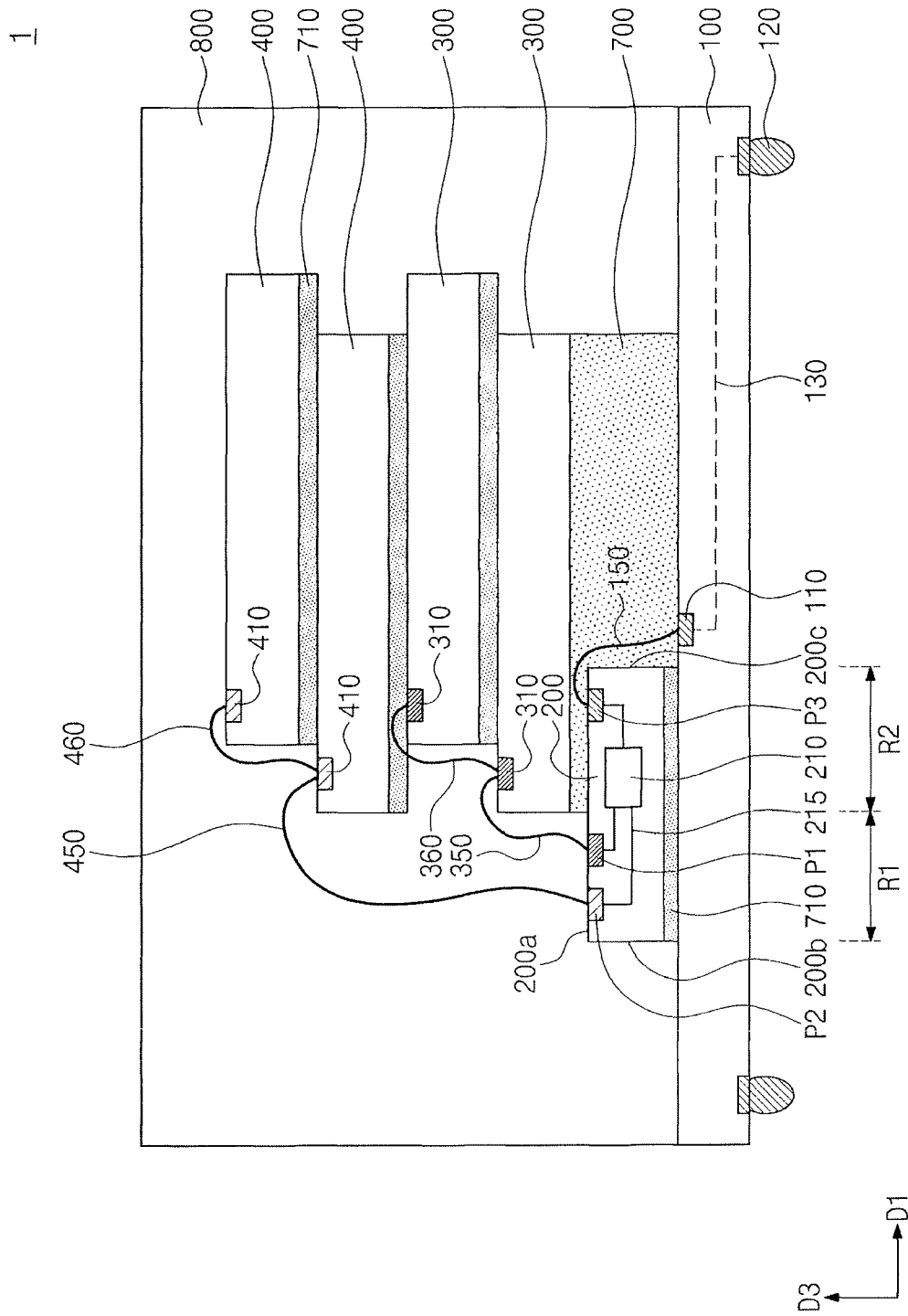
FIG. 2B illustrates a cross-sectional view taken along line I-II of FIG. 2A.

FIG. 1 illustrates a schematic diagram showing an electrical connection of a semiconductor package according to exemplary embodiments.

Referring to FIG. 1, a semiconductor package may include a substrate 100, a first semiconductor chip 200, a second semiconductor chip 300, and a third semiconductor chip 400. The substrate 100 may have an external terminal 120. External electrical signals and/or data may be transmitted from or to the substrate 100 through the external terminal 120. The first semiconductor chip 200 may include an integrated circuit section 210 and internal wiring lines 215 therein. The integrated circuit section 210 may include buffer circuits. In an implementation, the integrated circuit section 210 may include controller circuits. The internal wiring lines 215 may be electrically connected to the integrated circuit section 210.

The first semiconductor chip 200 may include a first pad P1, a second pad P2, and a third pad P3. The first pad P1 may be electrically connected to the second semiconductor chip 300. The second pad P2 may be electrically connected to the third semiconductor chip 400. In this description, the phrase "electrically connected" may include "directly connected" or "indirectly connected through other conductive component(s)". The phrase "electrically connected to a semiconductor chip" may mean that "electrically connected to integrated circuits of the semiconductor chip." The third pad P3 may be electrically connected to the external terminal 120. The first to third pads P1, P2, and P3 may be electrically connected through the internal wiring lines 215 to the integrated circuit section 210. The third pad P3 may be electrically connected through the integrated circuit section 210 to the first and second pads P1 and P2. The third pad P3 may serve as a path through which signals and/or data are transmitted to and from the first and second pads P1 and P2.

If one or a plurality of the second semiconductor chips 300 and one or a plurality of the third semiconductor chips 400 were to be electrically connected through one pad to the integrated circuit section 210, a large loading could be imposed on the pad when signals are transmitted to and from the second and third semiconductor chips 300 and 400. In addition, the pads or chips may be electrically connected to the third pad P3, and a large loading may also be imposed on the third pad P3. According to some embodiments, one or a plurality of the second semiconductor chips 300 may be electrically connected through the first pad P1 to the third pad P3, and one or a plurality of the third semiconductor chips 400 may be electrically connected through the second pad P2 to the third pad P3. Such connection relationship may help reduce the numbers of the chips (e.g. second semiconductor chips 300) that are connected to the first pad P1. In addition, such connection relationship may help reduce the numbers of the chips (e.g. third semiconductor chips 400) that are connected to the second pad P2. The second semiconductor chips 300 and the third semiconductor chips 400 may communicate signals and/or data (referred to hereinafter as signals) with the integrated circuit section 210, which signals may be distributed respectively to the first and second pads P1 and P2. The third pad P3 may transmit and receive the distributed signals. The semiconductor package may thus increase in operating speed.

FIG. 2A illustrates a plan view showing a semiconductor package according to exemplary embodiments. FIG. 2B illustrates a cross-sectional view taken along line I-II of FIG. 2A.

Referring to FIGS. 2A and 2B, a semiconductor package 1 may include a substrate 100, a first semiconductor chip 200, a second semiconductor chip 300, a third semiconductor chip 400, an encapsulant 700, and a molding layer 800. For example, the substrate 100 may include a printed circuit board. The substrate 100 may include a substrate pad 110 on its top surface. The substrate pad 110 may include metal such as copper or aluminum. The substrate 100 may include an external terminal 120 on its bottom surface (e.g., opposite to the top surface). The external terminal 120 may be electrically connected to the substrate pad 110 through a conductive line 130 within the substrate 100. In the drawing figures, a dotted line within the substrate 100 schematically indicates the conductive line 130 between the substrate pad 110 and the external terminal 120. In an implementation, the external terminal 120 may be shaped like a solder ball and may include a conductive material such as tin. The external terminal 120 may be coupled to an external device. External signals may thus be transmitted to and from the substrate pad 110 via the external terminal 120.

The first semiconductor chip 200 may be on the substrate 100. The first semiconductor chip 200 may include an integrated circuit section 210 and internal wiring lines 215 therein. In the drawing figures, solid lines within the first semiconductor chip 200 schematically indicate the internal wiring lines 215. In an implementation, the integrated circuit section 210 may include buffer circuits, and the first semiconductor chip 200 may serve as a buffer chip. When viewed in plan, the first semiconductor chip 200 may have a first region R1 and a second region R2. The first region R1 of the first semiconductor chip 200 may be adjacent to a first side surface 200b of the first semiconductor chip 200. The second region R2 of the first semiconductor chip 200 may be closer than the first region R1 to a second side surface 200c of the first semiconductor chip 200. The second side surface 200c of the first semiconductor chip 200 may stand opposite to the first side surface 200b. In this description, a first direction D1 and a second direction D2 may be parallel to the top surface of the substrate 100. The second direction D2 may intersect the first direction D1. A third direction D3 may intersect the first and second directions D1 and D2. The first and second side surfaces 200b and 200c of the first semiconductor chip 200 may be parallel to the third direction D3.

The first semiconductor chip 200 may include a first pad P1, a second pad P2, and a third pad P3, which first to third pads P1, P2, and P3 may be provided on a top surface 200a of the first semiconductor chip 200 (e.g., a surface facing away from the substrate 100). An electrical connection between the first to third pads P1, P2, and P3 may be substantially the same as that discussed above with reference to FIG. 1. The first to third pads P1, P2, and P3 may be spaced apart from each other. In an implementation, the first and second pads P1 and P2 may be disposed on the top surface 200a of the first region R1 of the first semiconductor chip 200. The first and second pads P1 and P2 may be exposed by the second semiconductor chip 300 (e.g., may not be covered by the second semiconductor chip 300). When viewed in plan, the second pad P2 may be closer than the first pad P1 to the first side surface 200b of the first semiconductor chip 200. In an implementation, the third pad P3 may be on the top surface 200a of the second region R2 of the first semiconductor chip 200. The third pad P3 may be electrically connected through the integrated circuit section 210 to the first and second pads P1 and P2, as discussed above with reference to FIG. 1. The first to third pads P1, P2, and P3 may include metal such as copper or aluminum.

As illustrated in FIG. 2A, the first pad P1 may be provided in plural. The first pads P1 may constitute or be arranged in a row parallel to the second direction D2. The second pad P2 may be provided in plural. The second pads P2 may constitute or be arranged in a row parallel to the second direction D2. The third pad P3 may be provided in plural. The third pads P3 may constitute or be arranged in a row parallel to the second direction D2. For brevity of description, the following explains an example in which each of the first to third pads P1, P2, and P3 is described in single.

The second semiconductor chip 300 may be on the top surface 200a of the second region R2 of the first semiconductor chip 200. When viewed in plan, the second semiconductor chip 300 may shift or be offset in the first direction D1 from the first side surface 200b of the first semiconductor chip 200. The second semiconductor chip 300 may expose the top surface 200a of the first region R1 of the first semiconductor chip 200. The second semiconductor chip 300 may perform a different function from that of the first semiconductor chip 200. In an implementation, the second semiconductor chip 300 may serve as a memory chip. In an implementation, the semiconductor package 1 may include a plurality of stacked second semiconductor chips 300. In an implementation, a suitable number of the second semiconductor chips 300 may be included. Top surfaces of the second semiconductor chips 300 may be active surfaces. For example, each of the second semiconductor chips 300 may have a chip pad 310 exposed on the top surface thereof. The second semiconductor chips 300 may be electrically connected to each other by a first conductor 360. The first conductor 360 may be a bonding wire. The bonding wire may include metal such as gold or silver. The second semiconductor chips 300 may be stacked on the first semiconductor chip 200, which arrangement may help reduce a size of the semiconductor package 1.

The third semiconductor chip 400 may be stacked on the second semiconductor chip 300. The third semiconductor chip 400 and the second semiconductor chip 300 may be of the same type. In an implementation, the third semiconductor chip 400 may be a memory chip. In an implementation, the third semiconductor chip 400 may have the same size and storage capacity as those of the second semiconductor chip 300. The semiconductor package 1 may include a plurality of stacked third semiconductor chips 400. The third semiconductor chips 400 may be electrically connected to each other by a second conductor 460. The second conductor 460 may be a bonding wire. A lowermost one of the third semiconductor chips 400 may shift (e.g., be offset or misaligned) in a reverse direction to the first direction D1 from or relative to an uppermost one of the second semiconductor chips 300. The third semiconductor chips 400 may be variously changed in planar arrangement. In an implementation, the lowermost third semiconductor chip 400 may be shifted or offset in the first direction D1 from or relative to the uppermost second semiconductor chip 300. In an implementation, the lowermost third semiconductor chip 400 and the uppermost second semiconductor chip 300 may be aligned with each other in the third direction D3 (e.g., edges of the chips may be aligned or coplanar). In an implementation, a suitable number of the second and third semiconductor chips 300 and 400 may be included. The following describes in detail an electrical connection of the semiconductor package 1.

A first connector 350 may be provided on one of the second semiconductor chips 300 and may be coupled to the first pad P1 and the chip pad 310 of the one of the second semiconductor chips 300. The second semiconductor chips 300 may be coupled through the first connector 350 and the first pad P1 to the integrated circuit section 210 of the first semiconductor chip 200. The first connector 350 may be a bonding wire. In an implementation, the first conductor 360 may be coupled to the first pad P1 and the chip pad 310 of other of the second semiconductor chips 300.

A second connector 450 may be provided on one of the third semiconductor chips 400 and may be coupled to the second pad P2 and a chip pad 410 of the one of the third semiconductor chips 400. The third semiconductor chips 400 may be coupled through the second connector 450 and the second pad P2 to the integrated circuit section 210 of the first semiconductor chip 200. The second connector 450 may be a bonding wire. In an implementation, the second conductor 460 may be coupled to the second pad P2 and a chip pad 410 of other of the third semiconductor chips 400.

A third connector 150 may be provided on the second region R2 of the first semiconductor chip 200 and may be coupled to the third pad P3 and the substrate pad 110. The third pad P3 may thus be electrically connected to the external terminal 120. The third connector 150 may be a bonding wire. The second semiconductor chips 300 and the third semiconductor chips 400 may communicate signals with the third pad P3, which signals may be distributed respectively to the first and second pads P1 and P2. The semiconductor package 1 may then increase in operating speed.

If the first region R1 of the first semiconductor chip 200 were to be covered with the second semiconductor chip 300, it could be difficult to directly connect the first and second connectors 350 and 450 respectively to the first and second pads P1 and P2. In an implementation, the first region R1 of the first semiconductor chip 200 may be exposed such that the first connector 350 may be directly connected to the first pad P1. Likewise, the second connector 450 may be directly connected to the second pad P2. An operating speed of the semiconductor package 1 may be accordingly increased due to a reduction in electrical path between the first semiconductor chip 200 and the second semiconductor chips 300 and between the first semiconductor chip 200 and the third semiconductor chips 400.

The encapsulant 700 may be provided between the first semiconductor chip 200 and the second semiconductor chip 300, and covering the second region R2 of the first semiconductor chip 200. The encapsulant 700 may cover the third pad P3. The encapsulant 700 may expose the first region R1 of the first semiconductor chip 200. The encapsulant 700 may be further provided on the second side surface 200*c* of the first semiconductor chip 200, and filling a gap between the substrate 100 and a lowermost one of the second semiconductor chips 300. In this case, the encapsulant 700 may help support the second semiconductor chips 300. The encapsulant 700 may include an insulating polymer.

Adhesive layers 710 may be interposed between the substrate 100 and the first semiconductor chip 200, between the second semiconductor chips 300, between the uppermost second semiconductor chip 300 and the lowermost third semiconductor chip 400, and between the third semiconductor chips 400. The adhesive layers 710 may include an insulating polymer.

The substrate 100 may include the molding layer 800 covering the first semiconductor chip 200, the second semiconductor chips 300, and the third semiconductor chips 400 thereon. For example, the molding layer 800 may cover the first region R1 of the first semiconductor chip 200. The molding layer 800 may be spaced apart from the top surface 200*a* of the second region R2 of the first semiconductor chip 200 (e.g., the molding layer 800 may not contact the top surface 200*a* of the second region R2 of the first semiconductor chip 200). The molding layer 800 may include an insulating polymer such as an epoxy-based molding compound.

In an implementation, the semiconductor package 1 may include a single second semiconductor chip 300. In an implementation, the semiconductor package 1 may include a single third semiconductor chip 400. In an implementation, the semiconductor package 1 may further include an additional semiconductor chip stacked on the third semiconductor chip 400. In this case, a fourth pad may further be provided on the top surface 200*a* of the first semiconductor chip 200 and be electrically connected to the additional semiconductor chip.

Figure 3B:
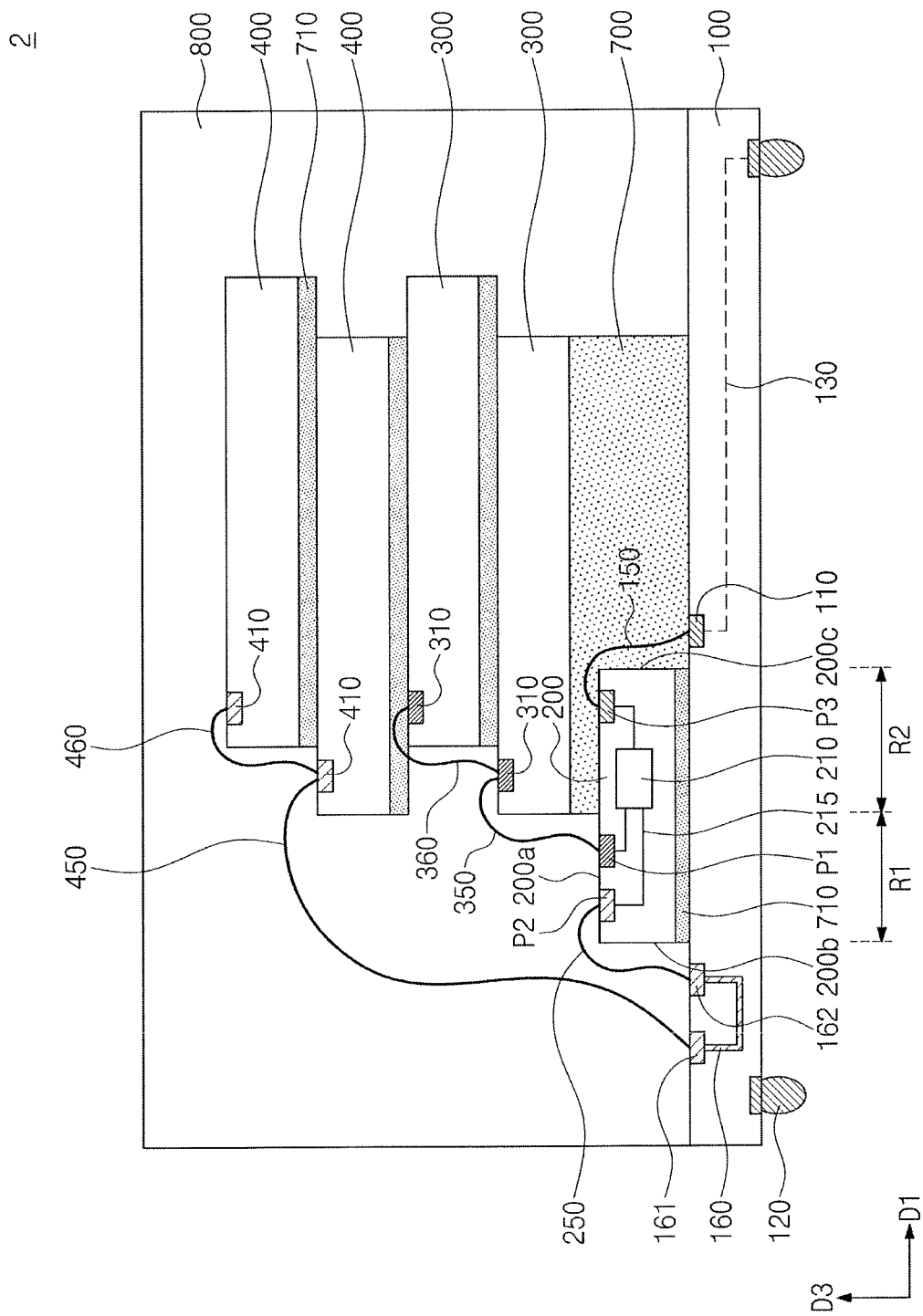
FIG. 3B illustrates a cross-sectional view taken along line I-II of FIG. 3A.

FIG. 3A illustrates a plan view showing a semiconductor package according to exemplary embodiments. FIG. 3B illustrates a cross-sectional view taken along line I-II of FIG. 3A. A description duplicate with the aforementioned may be omitted hereinafter.

Referring to FIGS. 1, 3A, and 3B, a semiconductor package 2 may include the substrate 100, the first semiconductor chip 200, the second semiconductor chips 300, the third semiconductor chips 400, the encapsulant 700, and the molding layer 800. The substrate 100, the first semiconductor chip 200, the second semiconductor chips 300, the third semiconductor chips 400, the encapsulant 700, and the molding layer 800 may be substantially the same as those discussed above with reference to FIGS. 2A and 2B. The first pad P1, the first connector 350, the third pad P3, and the third connector 150 may have their arrangement and electrical connection that are substantially the same as those discussed above with reference to FIGS. 2A and 2B.

A first connection pad 161 and a second connection pad 162 may be provided on the top surface of the substrate 100. When viewed in plan, the first and second connection pads 161 and 162 may be adjacent to the first region R1 of the first semiconductor chip 200 and exposed by the first semiconductor chip 200. The second connection pad 162 may be closer than the first connection pad 161 to the first semiconductor chip 200 (e.g., the second connection pad 162 may be between the first connection pad 161 and the first connection chip 200). A connection line 160 may be provided in the substrate 100 and may be coupled to the first and second connection pads 161 and 162. The connection line 160 may be insulated from the substrate pad 110, the conductive line 130, and the external terminal 120.

The second connector 450 may be coupled to the first connection pad 161 and the chip pad 410 of one of the third semiconductor chips 400. The first connection pad 161 may be electrically connected through the connection line 160 to the second connection pad 162. A fourth connector 250 may be provided on the top surface 200a of the first region R1 of the first semiconductor chip 200 and may be coupled to the second pad P2 and the second connection pad 162. The third semiconductor chips 400 may thus be electrically connected to the second pad P2 through the third connector 150, the first connection pad 161, the connection line 160, the second connection pad 162, and the fourth connector 250. The fourth connector 250 may be a bonding wire.

Figure 4A:
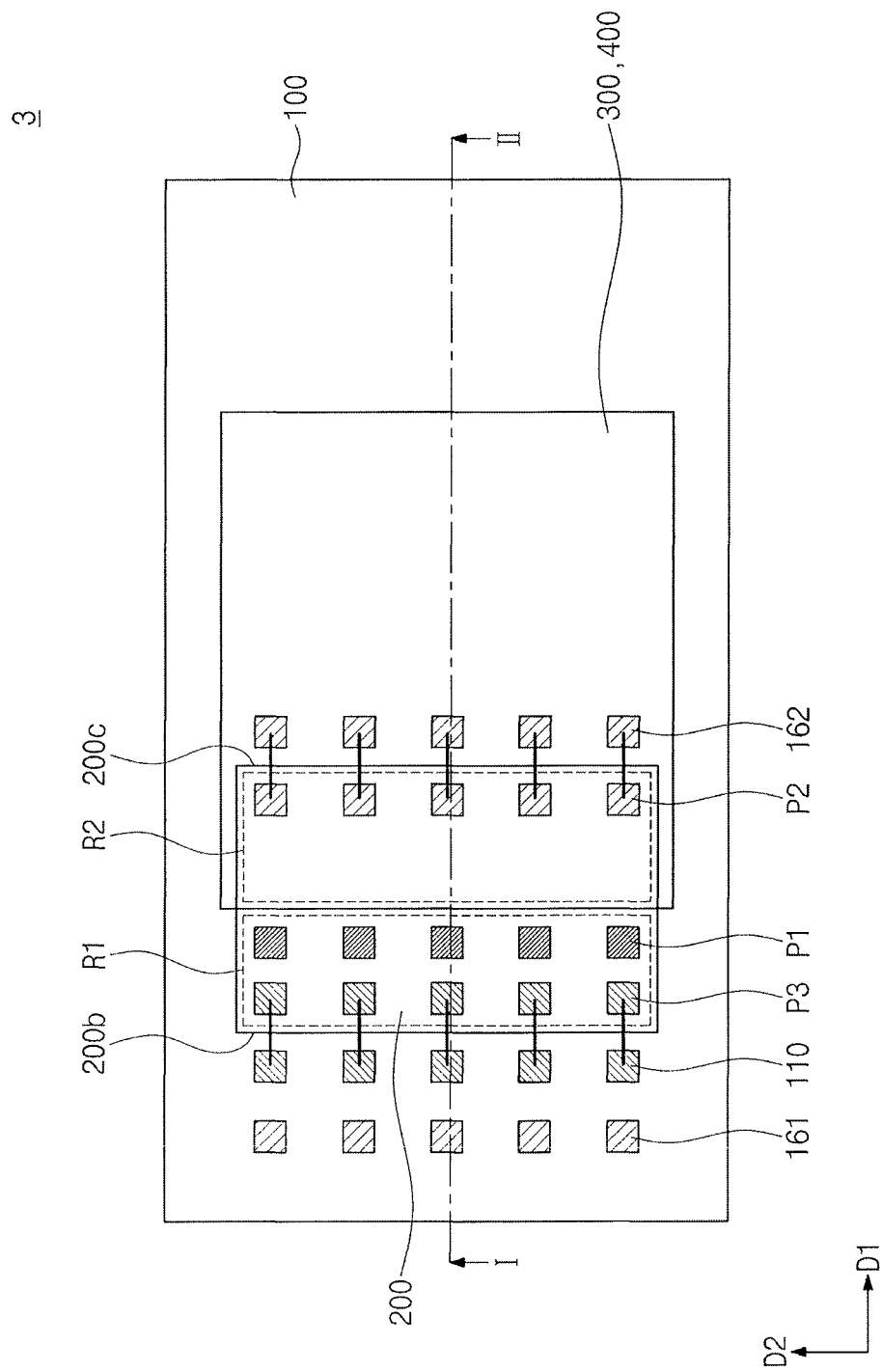
FIG. 4A illustrates a plan view showing a semiconductor package according to exemplary embodiments.
Figure 4B:
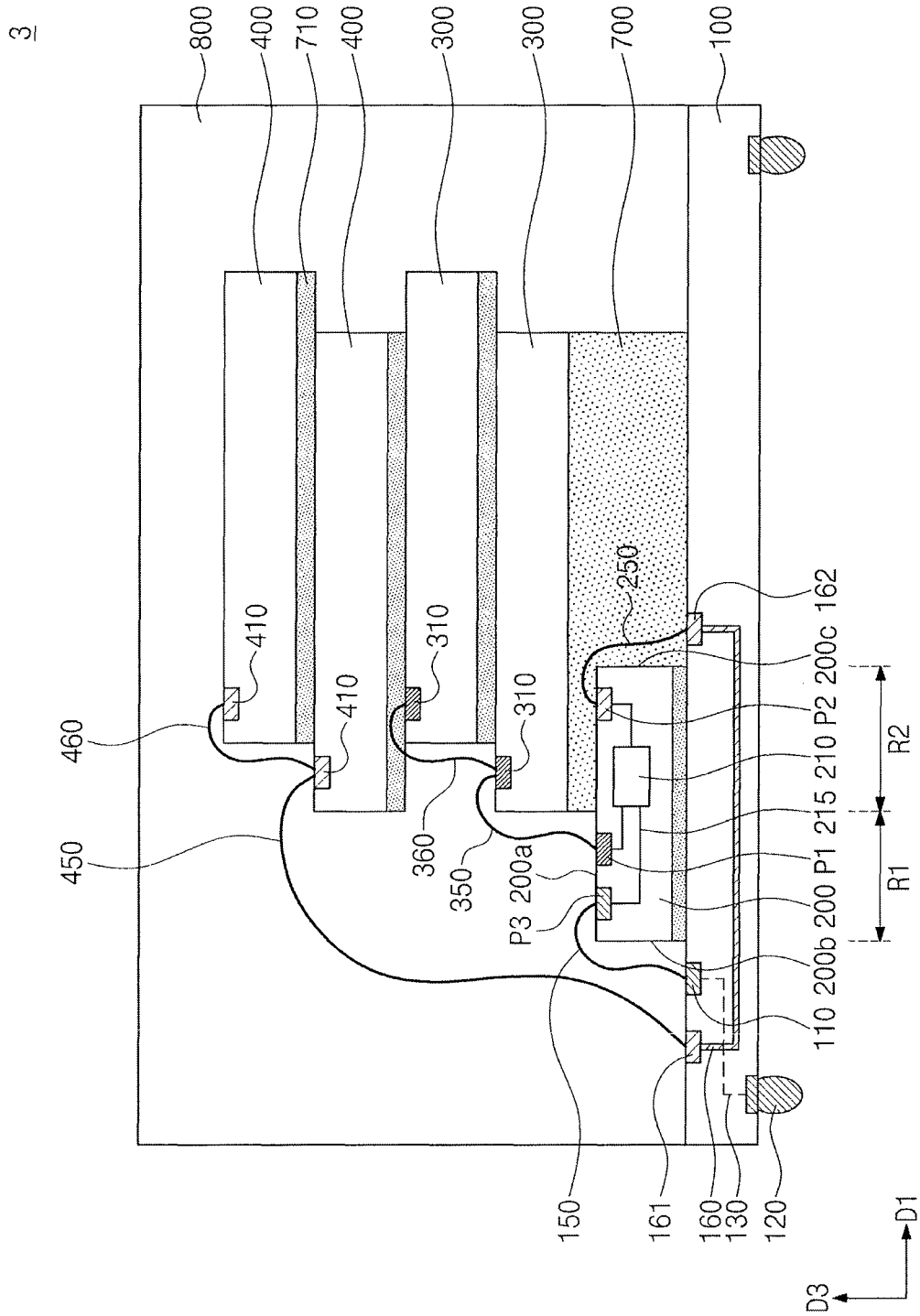
FIG. 4B illustrates a cross-sectional view taken along line I-II of FIG. 4A.

FIG. 4A illustrates a plan view showing a semiconductor package according to exemplary embodiments. FIG. 4B illustrates a cross-sectional view taken along line I-II of FIG. 4A. A description duplicate with the aforementioned may be omitted hereinafter.

Referring to FIGS. 1, 4A, and 4B, a semiconductor package 3 may include the substrate 100, the first semiconductor chip 200, the second semiconductor chips 300, the third semiconductor chips 400, the encapsulant 700, and the molding layer 800. The substrate 100, the first semiconductor chip 200, the second semiconductor chips 300, the third semiconductor chips 400, the encapsulant 700, and the molding layer 800 may be substantially the same as those discussed above with reference to FIGS. 2A and 2B. The first pad P1 and the first connector 350 may have their arrangement and electrical connection that are substantially the same as those discussed above with reference to FIGS. 2A and 2B.

The second pad P2 may be disposed on the top surface 200a of the second region R2 of the first semiconductor chip 200. The second connector 450 may be coupled to the first connection pad 161 and the chip pad 410 of one of the third semiconductor chips 400. The first connection pad 161 may be electrically connected through the connection line 160 to the second connection pad 162. The second connection pad 162 may be adjacent to the second region R2 of the first semiconductor chip 200. The fourth connector 250 may be provided on the top surface 200a of the second region R2 of the first semiconductor chip 200 and may be coupled to the second pad P2 and the second connection pad 162. The third semiconductor chips 400 may be electrically connected to the second pad P2 through the second connector 450, the first connection pad 161, the connection line 160, the second connection pad 162, and the fourth connector 250.

The third pad P3 may be disposed on the top surface 200a of the first region R1 of the first semiconductor chip 200. When viewed in plan, the second pad P2 may be closer than the first pad P1 to the second side surface 200c of the first semiconductor chip 200. The third connector 150 may be provided on the first region R1 of the first semiconductor chip 200 and be coupled to the third pad P3 and the substrate pad 110. The third pad P3 may be electrically connected through the integrated circuit section 210 to the first and second pads P1 and P2.

Figure 5A:
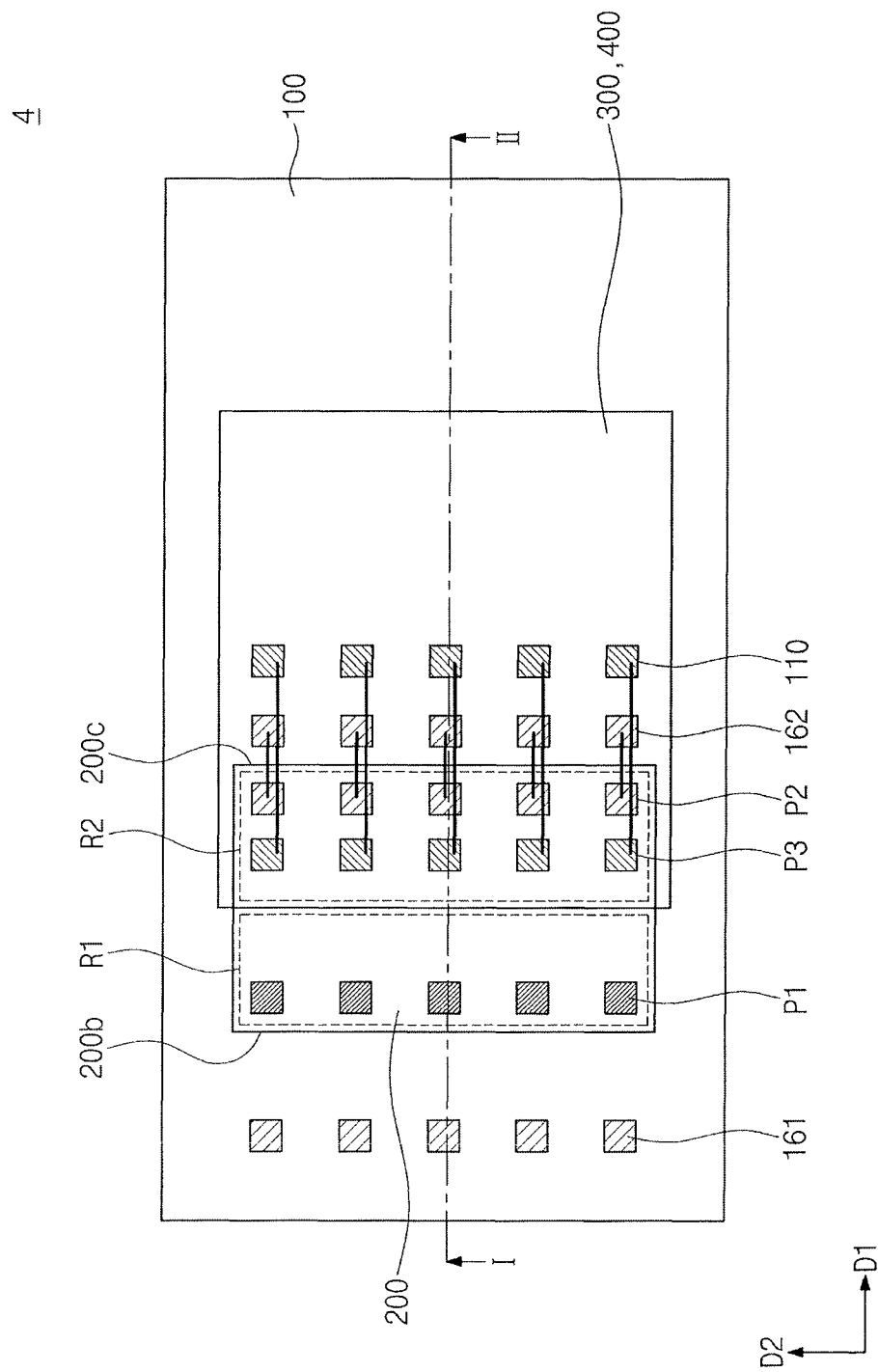
FIG. 5A illustrates a plan view showing a semiconductor package according to exemplary embodiments.
Figure 5B:
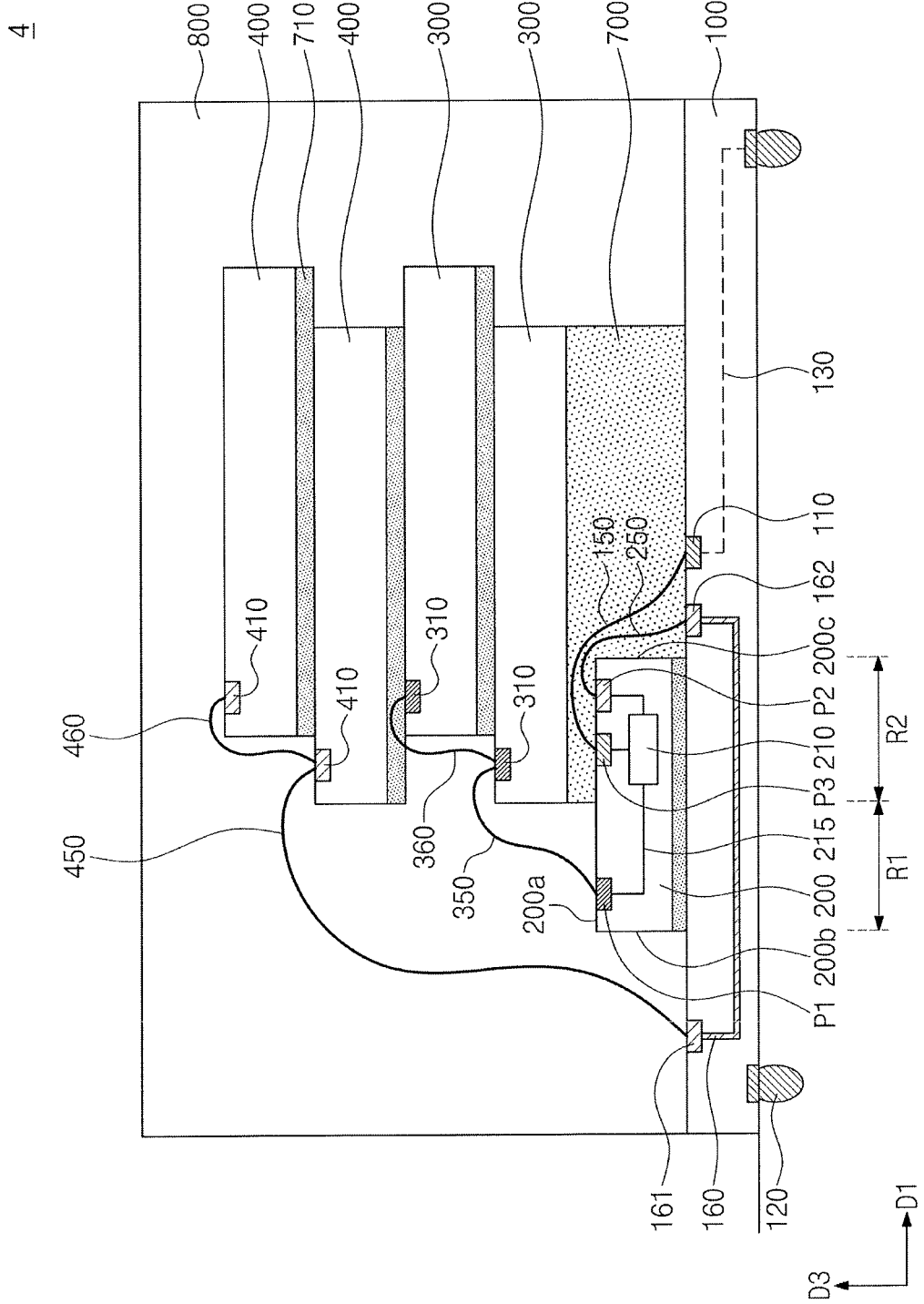
FIG. 5B illustrates a cross-sectional view taken along line I-II of FIG. 5A.
Figure 6B:
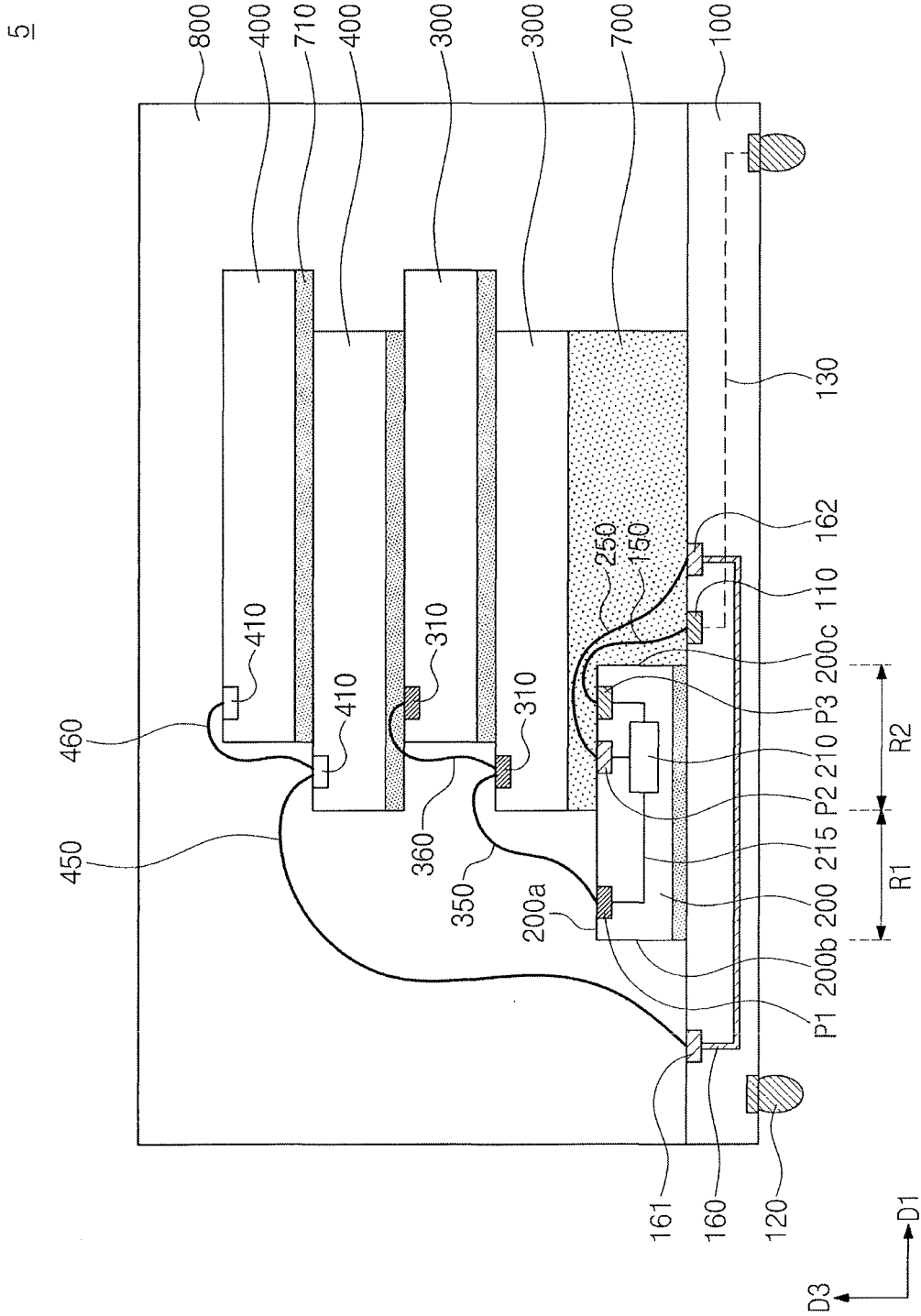
FIG. 6B illustrates a cross-sectional view taken along line I-II of FIG. 6A.

FIG. 5A illustrates a plan view showing a semiconductor package according to exemplary embodiments. FIG. 5B illustrates a cross-sectional view taken along line I-II of FIG. 5A. FIG. 6A illustrates a plan view showing a semiconductor package according to exemplary embodiments. FIG. 6B illustrates a cross-sectional view taken along line I-II of FIG. 6A. A description duplicate with the aforementioned may be omitted hereinafter.

Referring to FIGS. 1, 5A, 5B, 6A, and 6B, each of semiconductor packages 4 and 5 may include the substrate 100, the first semiconductor chip 200, the second semiconductor chips 300, the third semiconductor chips 400, the encapsulant, and the molding layer 800. The substrate 100, the first semiconductor chip 200, the second semiconductor chips 300, the third semiconductor chips 400, the encapsulant 700, and the molding layer 800 may be substantially the same as those discussed above with reference to FIGS. 2A and 2B. As discussed with reference to FIGS. 2A and 2B, the first pad P1 may be disposed on the top surface 200a of the first region R1 of the first semiconductor chip 200. The second semiconductor chips 300 may be coupled through the first connector 350 to the first pad P1.

The second pad P2 may be disposed on the top surface 200a of the second region R2 of the first semiconductor chip 200. The second pad P2, the second connector 450, the first connection pad 161, the second connection pad 162, the connection line 160, and the third connector 150 may have their arrangement and electrical connection that are substantially the same as those discussed with reference to FIGS. 4A and 4B. For example, the third semiconductor chips 400 may be electrically connected to the second pad P2 through the second connector 450, the first connection pad 161, the connection line 160, the second connection pad 162, and the fourth connector 250.

The third pad P3 may be provided on the top surface 200a of the second region R2 of the first semiconductor chip 200. The third connector 150 may be provided on the second region R2 of the first semiconductor chip 200 and may be coupled to the third pad P3 and the substrate pad 110.

Referring to FIGS. 5A and 5B, when viewed in plan, the second pad P2 may be closer than the third pad P3 to the second side surface 200c of the first semiconductor chip 200. The distance between the second connection pad 162 and the second side surface 200c of the first semiconductor chip 200 may be smaller than the distance between the substrate pad 110 and the second side surface 200c of the first semiconductor chip 200.

Referring to FIGS. 6A and 6B, when viewed in plan, the third pad P3 may be closer than the second pad P2 to the second side surface 200c of the first semiconductor chip 200. The substrate pad 110 may be closer than the second connection pad 162 to the second side surface 200c of the first semiconductor chip 200.

Figure 7:
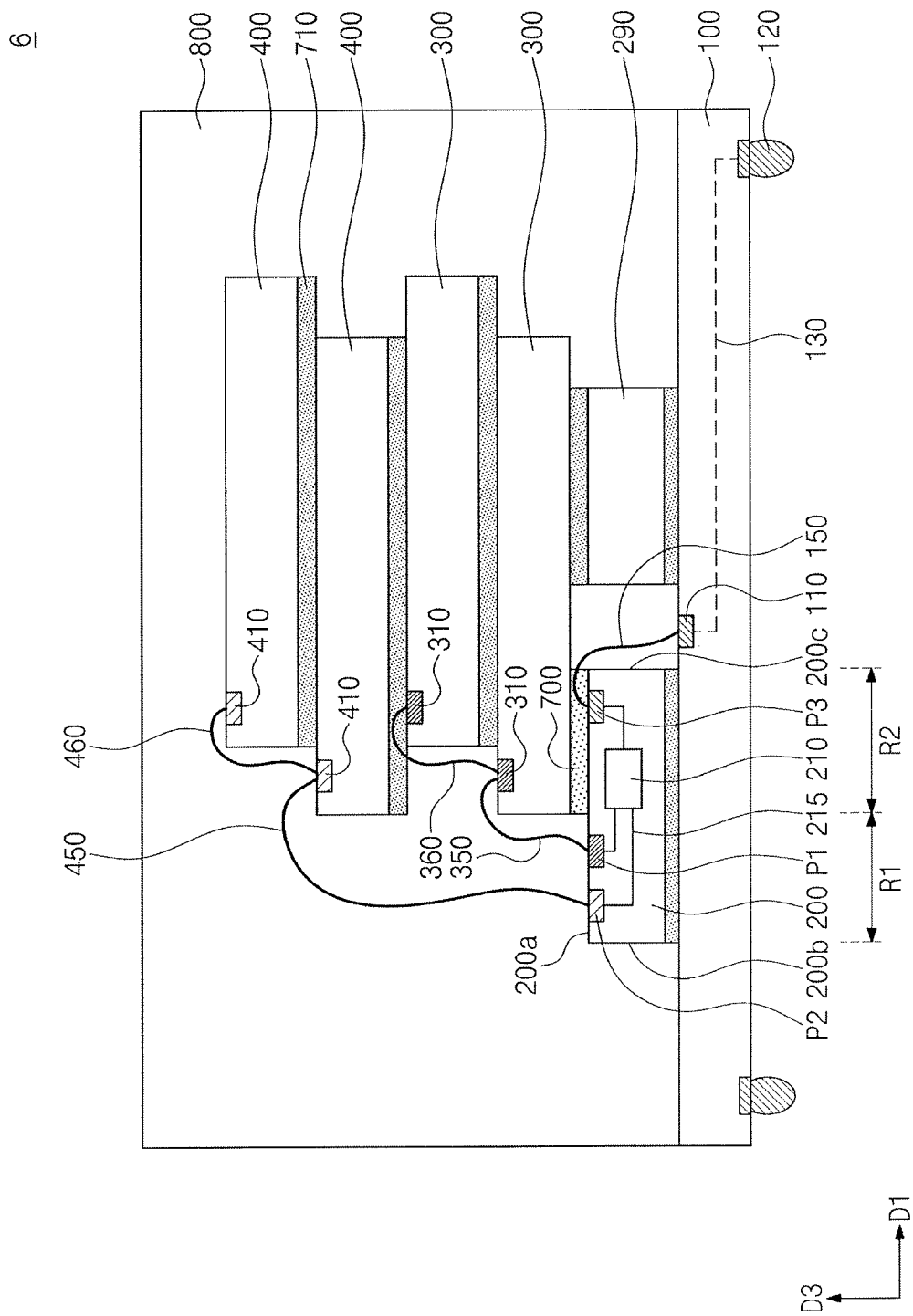
FIG. 7 illustrates a cross-sectional view showing a semiconductor package according to exemplary embodiments.

FIG. 7 illustrates a cross-sectional view taken along line I-II of FIG. 2A, showing a semiconductor package according to exemplary embodiments. A description duplicate with the aforementioned may be omitted hereinafter.

Referring to FIGS. 1, 2A, and 7, a semiconductor package 6 may further include a support structure 290 in addition to the substrate 100, the first semiconductor chip 200, the second semiconductor chips 300, the third semiconductor chips 400, the encapsulant 700, and the molding layer 800.

The support structure 290 may be interposed between the substrate 100 and a lowermost second semiconductor chip 300, thereby supporting the second semiconductor chips 300. The support structure 290 may be spaced apart from the second side surface 200c of the first semiconductor chip 200. The support structure 290 may expose the substrate pad 110. The support structure 290 may be electrically connected to none of the substrate 100, the first semiconductor chip 200, the second semiconductor chips 300, and the third semiconductor chips 400 (e.g., may be electrically isolated). A dummy spacer chip may be used as the support structure 290.

The encapsulant 700 may be interposed between the substrate 100 and the lowermost second semiconductor chip 300.

The substrate 100, the first semiconductor chip 200, the second semiconductor chips 300, the third semiconductor chips 400, and the molding layer 800 may be substantially the same as those discussed above with reference to FIGS. 2A and 2B. The first to third pads P1, P2, and P3 may have their arrangement and electrical connection that are substantially the same as those discussed above with reference to FIGS. 2A and 2B. In an implementation, the first to third pads P1, P2, and P3 may have their arrangement and electrical connection that are substantially the same as those of the example discussed above with reference to FIGS. 3A and 3B, FIGS. 4A and 4B, FIGS. 5A and 5B, or FIGS. 6A and 6B.

Figure 8:
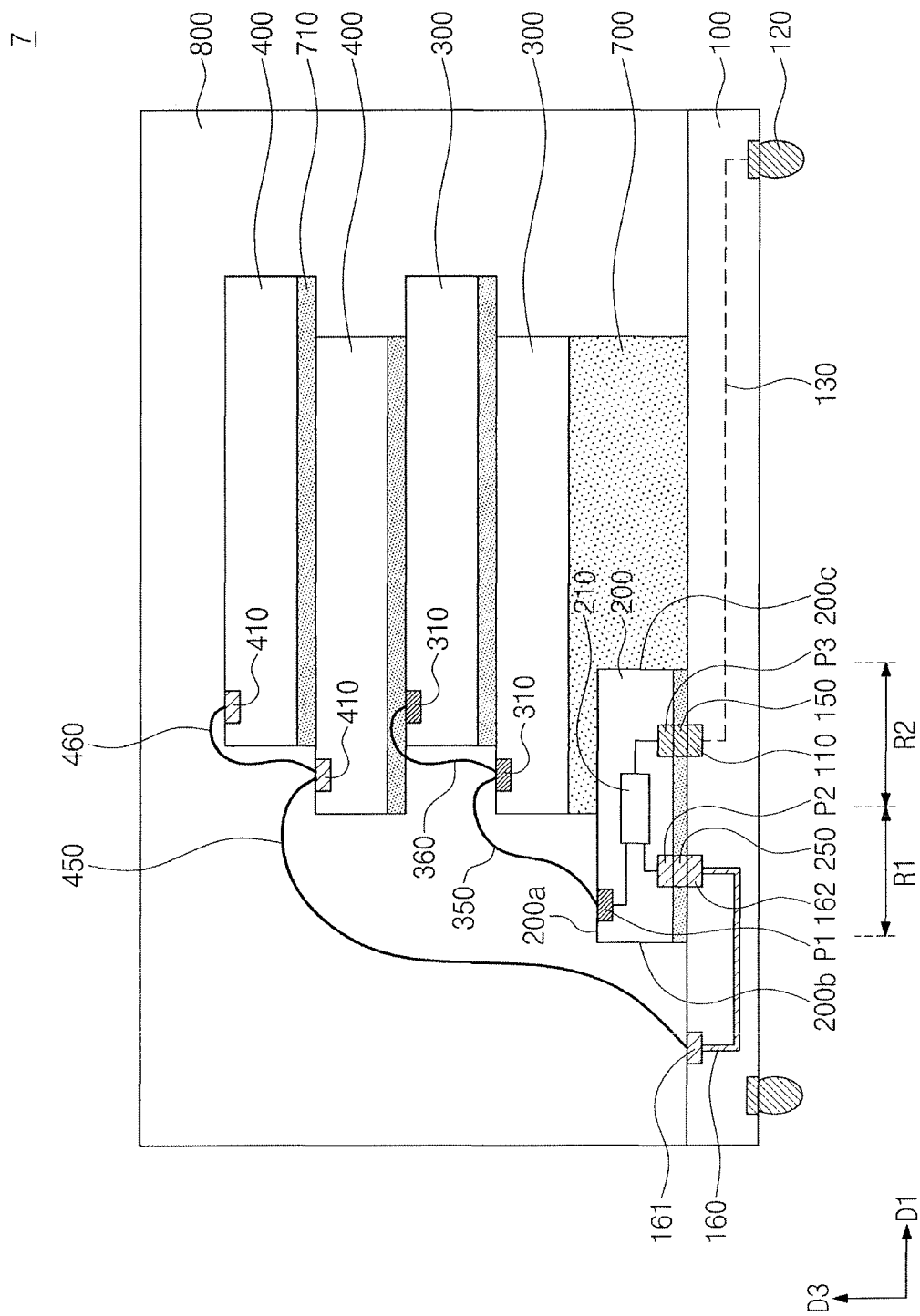
FIG. 8 illustrates a cross-sectional view showing a semiconductor package according to exemplary embodiments.

FIG. 8 illustrates a cross-sectional view showing a semiconductor package according to exemplary embodiments. A description duplicate with the aforementioned may be omitted hereinafter.

Referring to FIGS. 1 and 8, a semiconductor package 7 may include the substrate 100, the first semiconductor chip 200, the second semiconductor chips 300, the third semiconductor chips 400, the encapsulant 700, and the molding layer 800. The substrate 100, the first semiconductor chip 200, the second semiconductor chips 300, the third semiconductor chips 400, the encapsulant 700, and the molding layer 800 may be substantially the same as those discussed above with reference to FIGS. 2A and 2B. The first pad P1 and the first connector 350 may have their arrangement and electrical connection that are substantially the same as those discussed above with reference to FIGS. 2A and 2B.

The second pad P2 may be disposed on a bottom surface of the first semiconductor chip 200. The bottom surface of the first semiconductor chip 200 may be opposite to the top surface 200a of the first semiconductor chip 200. The third semiconductor chips 400 may be electrically connected to the second pad P2 through the second connector 450, the first connection pad 161, the connection line 160, the second connection pad 162, and the fourth connector 250. The first connection pad 161 may be exposed by the first semiconductor chip 200, and when viewed in plan, the second connection pad 162 may overlap or underlie the first semiconductor chip 200. The fourth connector 250 may be interposed between the second connection pad 162 and the second pad P2. The fourth connector 250 may include one or more of bump, solder, and pillar.

The third pad P3 may be disposed on the bottom surface of the first semiconductor chip 200. The third connector 150 may be interposed between the substrate 100 and the first semiconductor chip 200 and thereby connected to the substrate pad 110 and the third pad P3. The third connector 150 may include one or more of bump, solder, and pillar. The third pad P3 may be electrically connected through the integrated circuit section 210 to the first and second pads P1 and P2. In an implementation, the first semiconductor chip 200 may include a through electrode therein.

In an implementation, one of the second and third pads P2 and P3 may be disposed on the top surface 200a of the first semiconductor chip 200. When the second pad P2 is disposed on the top surface 200a of the first semiconductor chip 200, a bonding wire may be used as the fourth connector 250. When the third pad P3 is disposed on the top surface 200a of the first semiconductor chip 200, a bonding wire may be used as the third connector 150.

Figure 9:
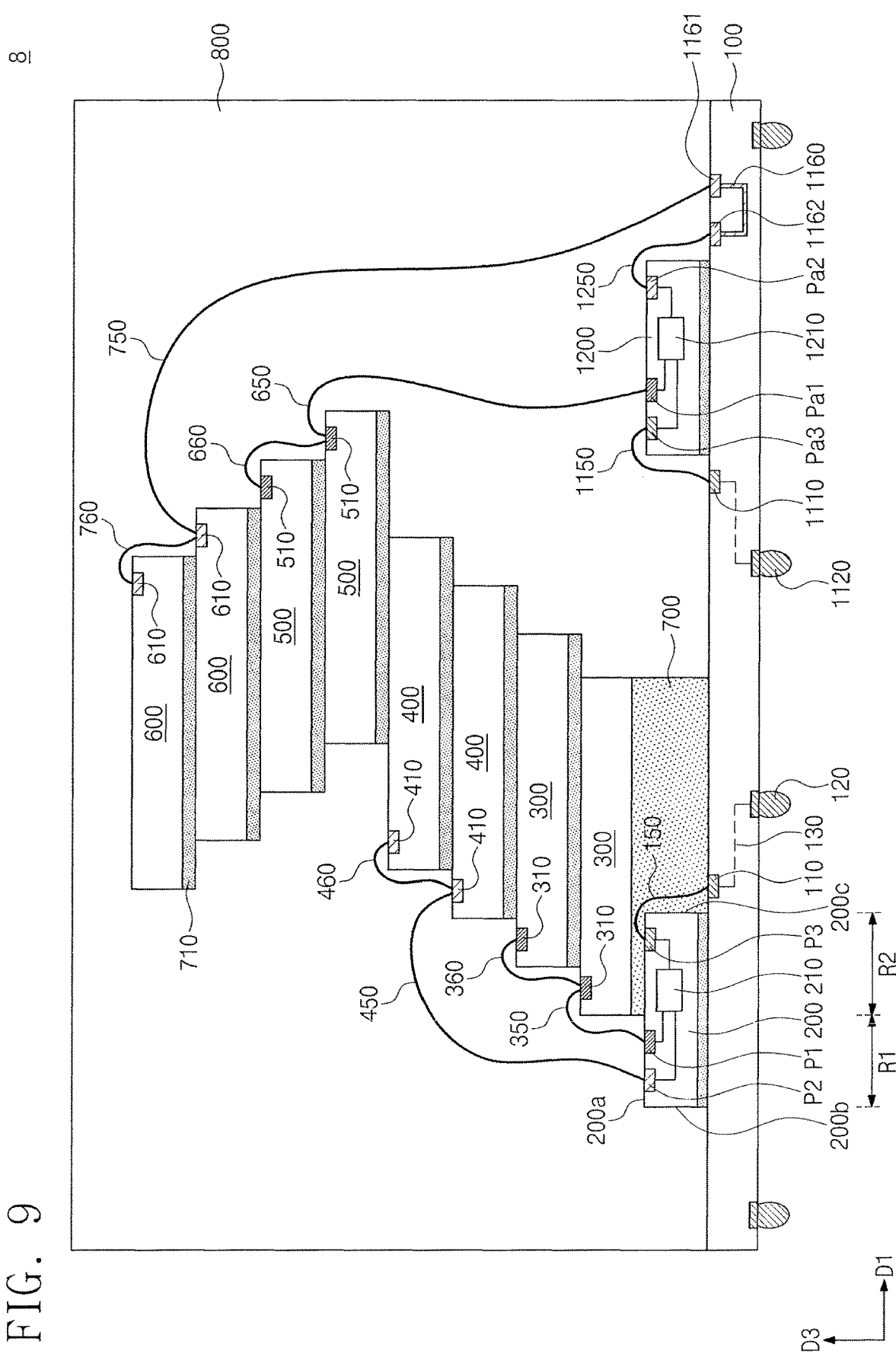
FIG. 9 illustrates a cross-sectional view showing a semiconductor package according to exemplary embodiments.

FIG. 9 illustrates a cross-sectional view showing a semiconductor package according to exemplary embodiments. A description duplicate with the aforementioned may be omitted hereinafter.

Referring to FIGS. 1 and 9, a semiconductor package 8 may further include a fourth semiconductor chip 500, a fifth semiconductor chip 600, and a sixth semiconductor chip 1200 in addition to the substrate 100, the first semiconductor chip 200, the second semiconductor chips 300, the third semiconductor chips 400, the encapsulant 700, and the molding layer 800. The substrate 100, the first semiconductor chip 200, the second semiconductor chips 300, the third semiconductor chips 400, the first pad P1, the second pad P2, and the third pad P3 may be substantially the same as those discussed above with reference to FIGS. 2A and 2B. In an implementation, the first to third pads P1, P2, and P3 may have their arrangement and electrical connection that are substantially the same as those of the example discussed above with reference to FIGS. 3A and 3B, FIGS. 4A and 4B, FIGS. 5A and 5B, or FIGS. 6A and 6B.

A plurality of the fourth semiconductor chips 500 may be stacked on the third semiconductor chips 400. The fourth semiconductor chips 500 may be memory chips. The fourth semiconductor chips 500 may be electrically connected to each other by a third conductor 660. The third conductor 660 may be a bonding wire. A plurality of the fifth semiconductor chips 600 may be stacked on the fourth semiconductor chips 500. The fifth semiconductor chips 600 may be memory chips. The fifth semiconductor chips 600 may be electrically connected to each other by a fourth conductor 760. The fourth conductor 760 may be a bonding wire.

The sixth semiconductor chip 1200 may be disposed on the top surface of the substrate 100. The sixth semiconductor chip 1200 may be spaced apart from the first semiconductor chip 200. The sixth semiconductor chip 1200 may serve as a buffer chip. The sixth semiconductor chip 1200 may have a first conductive pad Pa1, a second conductive pad Pa2, and a third conductive pad Pa3, which first to third conductive pads Pa1, Pa2, and Pa3 may be provided on a top surface of the sixth semiconductor chip 1200. The first to third conductive pads Pa1, Pa2, and Pa3 may be spaced apart from each other. The first to third conductive pads Pa1, Pa2, and Pa3 may include metal. The first and second conductive pads Pa1 and Pa2 may be electrically connected to the third conductive pad Pa3 through an integrated circuit section 1210.

A fifth connector 650 may be provided on one of the fourth semiconductor chips 500 and may be coupled to the first conductive pad Pa1 and a chip pad 510 of the one of the fourth semiconductor chips 500. The fourth semiconductor chips 500 may be electrically connected through the fifth connector 650 to the sixth semiconductor chip 1200. The fifth connector 650 may be a bonding wire. In an implementation, the fifth connector 650 may be coupled through the substrate 100 to the first conductive pad Pa1, as the connection between the second connector 450 and the second pad P2 discussed above with reference to FIGS. 3A and 3B.

A first conductive connection pad 1161 and a second conductive connection pad 1162 may be provided on the top surface of the substrate 100. A sixth connector 750 may be provided on the one of the fifth semiconductor chips 600 and may be coupled to the first conductive connection pad 1161 and a chip pad 610 of the one of the fifth semiconductor chips 600. A conductive connection line 1160 may be provided in the substrate 100 and may be electrically connected to the first conductive connection pad 1161 and the second conductive connection pad 1162. A conductive connector 1250 may be coupled to the second conductive connection pad 1162 and the second conductive pad Pa2. The conductive connector 1250 may be a bonding wire. The fifth semiconductor chips 600 may then be electrically connected to the second conductive pad Pa2.

A conductive substrate pad 1110 may be provided on the top surface of the substrate 100. An external conductive terminal 1120 may be provided on the bottom surface of the substrate 100. Signals transmitted to and from the external conductive terminal 1120 may be independent of signals transmitted to and from the external terminal 120. The external conductive terminal 1120 may be insulated from the external terminal 120. The external conductive terminal 1120 may be electrically connected to the conductive substrate pad 1110 through the conductive line 130 within the substrate 100. The conductive substrate pad 1110 may be spaced apart from and electrically insulated from the substrate pad 110.

A seventh connector 1150 may be provided on the sixth semiconductor chip 1200 may and be coupled to the third conductive pad Pa3 and the conductive substrate pad 1110. The third conductive pad Pa3 may thus be electrically connected to the external conductive terminal 1120. The seventh connector 1150 may be a bonding wire. The fourth semiconductor chips 500 and the fifth semiconductor chips 600 may communicate signals with the third conductive pad Pa3, which signals may be distributed respectively to the first and second conductive pads Pa1 and Pa2. The semiconductor package 8 may then increase in operating speed.

The fourth semiconductor chips 500 and the fifth semiconductor chips 600 may operate through different channels from those used for operating the second semiconductor chips 300 and the third semiconductor chips 400. The fourth semiconductor chips 500 and the fifth semiconductor chips 600 may be electrically connected to the integrated circuit section 1210 of the sixth semiconductor chip 1200. The fourth to sixth semiconductor chips 500, 600, and 1200 may operate independently of the first to third semiconductor chips 200, 300, and 400.

Adhesive layers 710 may further be interposed between the substrate 100 and the sixth semiconductor chip 1200, between an uppermost third semiconductor chip 400 and a lowermost fourth semiconductor chip 500, between the fourth semiconductor chips 500, between an uppermost fourth semiconductor chip 500 and a lowermost fifth semiconductor chip 600, and between the fifth semiconductor chips 600. The substrate 100 and the lowermost second semiconductor chip 300 may be provided with the support structure 290 therebetween, as discussed with reference to FIG. 8. In an implementation, the semiconductor package 8 may include a single fourth semiconductor chip 500 or a single fifth semiconductor chip 600.

As is traditional in the field, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope herein. Further, the blocks, units and/or modules of the embodiments may be physically combined into more complex blocks, units and/or modules without departing from the scope herein.

By way of summation and review, a semiconductor package may be configured such that a semiconductor chip is mounted on a printed circuit board (PCB) and bonding wires or bumps may be used to electrically connect the semiconductor chip to the printed circuit board. With the development of electronic industry, integrated circuits may have high performance and compactness.

According to an embodiment, second and third semiconductor chips may be stacked on a first semiconductor chip. A semiconductor package may accordingly become compact-sized. A first pad may be disposed on a top surface of the first semiconductor chip exposed by the second semiconductor chip. The second semiconductor chip may be coupled to the first pad without going through a substrate. A length of an electrical path may then be reduced between the first and second semiconductor chips. The second and third semiconductor chips may communicate signals and/or data with an integrated circuit section of the first semiconductor chip, which signals and/or data may be distributed to corresponding first and second pads. The semiconductor package may have an increased operating speed.

The embodiments may provide a semiconductor package including stacked semiconductor chips.

The embodiments may provide a compact semiconductor package.

The embodiments may provide a semiconductor package capable of operating at high speed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a substrate including an external terminal;
a first semiconductor chip on the substrate, the first semiconductor chip having a first region and a second region in a plan view;
at least one second semiconductor chip on the second region of the first semiconductor chip, the at least one second semiconductor chip exposing a top surface of the first region of the first semiconductor chip; and
at least one third semiconductor chip on the at least one second semiconductor chip,
wherein:
the first semiconductor chip includes:
a first pad electrically connected to the at least one second semiconductor chip;
a second pad electrically connected to the at least one third semiconductor chip; and a third pad electrically connected to the external terminal, the first pad is on the top surface of the first region, and at least one of the second pad and the third pad is on a top surface of the second region.

2. The semiconductor package as claimed in claim 1, wherein:

the first semiconductor chip includes an integrated circuit section therein, and the first pad and the second pad are electrically connected through the integrated circuit section to the third pad.

3. The semiconductor package as claimed in claim 2, wherein signals are transmittable to and from the first pad and the second pad through the third pad.

4. The semiconductor package as claimed in claim 1, further comprising a second connector on the at least one third semiconductor chip, the second connector being coupled to the second pad and a chip pad of the at least one third semiconductor chip, wherein the second pad is on the top surface of the first region of the first semiconductor chip.

5. The semiconductor package as claimed in claim 1, further comprising:

a first connection pad on the substrate;

a second connector on the at least one third semiconductor chip, the second connector being coupled to the first connection pad and a chip pad of the at least one third semiconductor chip, a connection line in the substrate and electrically connected to the first connection pad;

a second connection pad on the substrate and electrically connected to the connection line; and a third connector on the first semiconductor chip, the third connector being coupled to the second connection pad and the second pad.

6. The semiconductor package as claimed in claim 5, wherein the second pad is on the top surface of the second region of the first semiconductor chip.

7. The semiconductor package as claimed in claim 1, further comprising a first connector on a top surface of the at least one second semiconductor chip and coupled to the first pad.

8. The semiconductor package as claimed in claim 1, further comprising a support structure between the substrate and the at least one second semiconductor chip, wherein the support structure is spaced apart from the first semiconductor chip.

9. The semiconductor package as claimed in claim 1, further comprising an encapsulant between the first semiconductor chip and the at least one second semiconductor chip, wherein the encapsulant exposes the top surface of the first region of the first semiconductor chip.

10. The semiconductor package as claimed in claim 9, wherein the encapsulant extends onto a side surface of the first semiconductor chip and fills a gap between the substrate and the at least one second semiconductor chip.

11. The semiconductor package as claimed in claim 1, wherein the first semiconductor chip includes buffer circuits therein, the at least one second semiconductor chip includes a memory chip, and the at least one third semiconductor chip includes a memory chip.

12. The semiconductor package as claimed in claim 1, wherein:

the at least one second semiconductor chip includes a plurality of stacked second semiconductor chips, and the first pad is electrically connected to the plurality of stacked second semiconductor chips.

13. The semiconductor package as claimed in claim 1, wherein:

the at least one third semiconductor chip includes a plurality of stacked third semiconductor chips, the second pad is electrically connected to the plurality of stacked third semiconductor chips.

14. The semiconductor package as claimed in claim 1, further comprising a molding layer on the substrate and covering the first semiconductor chip and the at least one second semiconductor chip, wherein the molding layer covers the first region of the first semiconductor chip and is spaced apart from the top surface of the second region of the first semiconductor chip.

15. A semiconductor package, comprising:

a substrate;

a first semiconductor chip on the substrate and including a first pad, a second pad, and a third pad, the first pad, the second pad, and the third pad being on a top surface of the first semiconductor chip;

at least one second semiconductor chip on the first semiconductor chip, the at least one second semiconductor chip partially exposing the top surface of the first semiconductor chip; and at least one third semiconductor chip on the at least one second semiconductor chip, wherein:

the first pad is electrically connected to the at least one second semiconductor chip, the second pad is electrically connected to the at least one third semiconductor chip, the third pad is electrically connected to the first pad and the second pad, and the at least one second semiconductor chip exposes the first pad and covers at least one of the second pad and the third pad.

16. The semiconductor package as claimed in claim 15, wherein:

the substrate includes an external terminal on a bottom surface thereof, and the third pad is coupled through the substrate to the external terminal.

17. The semiconductor package as claimed in claim 15, wherein signals are transmittable to and from the first pad and the second pad through the third pad.

18. The semiconductor package as claimed in claim 15, further comprising a support structure between the substrate and the second semiconductor chip.

19. The semiconductor package as claimed in claim 15, wherein the at least one second semiconductor chip includes a plurality of stacked second semiconductor chips, and the at least one third semiconductor chip includes a plurality of stacked third semiconductor chips.

20. The semiconductor package as claimed in claim 15, further comprising:

a first bonding wire on the at least one second semiconductor chip and coupled to the first pad;

a second bonding wire on the at least one third semiconductor chip and coupled to the second pad; and a third bonding wire on the first semiconductor chip and coupled to the third pad.

* * * * *